United States Patent [19]

Hatcher, Jr.

[11] Patent Number: 4,836,883
[45] Date of Patent: Jun. 6, 1989

[54] METHOD OF PERFORMING ELECTRICAL REJECT SELECTION

[75] Inventor: Owen W. Hatcher, Jr., Sunnyvale, Calif.

[73] Assignee: Advanced Micro Devices, Inc., Sunnyvale, Calif.

[21] Appl. No.: 203,465

[22] Filed: Jun. 7, 1988

[51] Int. Cl.[4] .......... B44C 1/22; C03C 15/00; C03C 25/06; C23F 1/02

[52] U.S. Cl. .................. 156/627; 156/634; 156/653; 156/656; 156/657; 156/659.1; 437/190; 437/194; 437/228; 357/71

[58] Field of Search .......... 156/626, 627–629, 156/630, 633, 634–643, 646, 652, 653–656, 657, 659.1; 437/190, 192, 194, 195, 203, 228–238, 245; 204/192.32, 192.35, 192.37; 357/65, 69, 71; 324/500, 538

[56] References Cited

U.S. PATENT DOCUMENTS 4,510,674  4/1985  Izu et al. .................. 156/627 X
4,514,436  4/1985  Moerschel .................. 156/627 X Primary Examiner—William A. Powell
Attorney, Agent, or Firm—Fliesler, Dubb, Meyer & Lovejoy

[57] ABSTRACT

A method of detecting defects in a passivating layer includes the step of providing masks on any portions of a device intentionally exposed through the passivating layer, exposing the device to an etchant which penetrates the passivating layer through any defects therein and etches any interconnects underlying the defects, and testing to detect any portions of the interconnect which are etched.

18 Claims, 4 Drawing Sheets

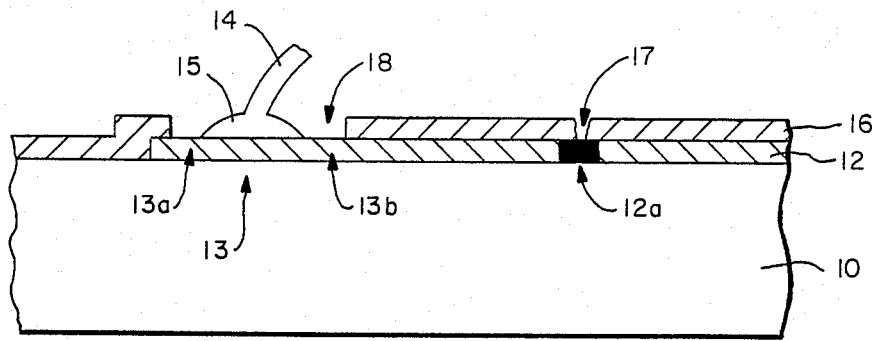
(PRIOR ART)
FIG.—1
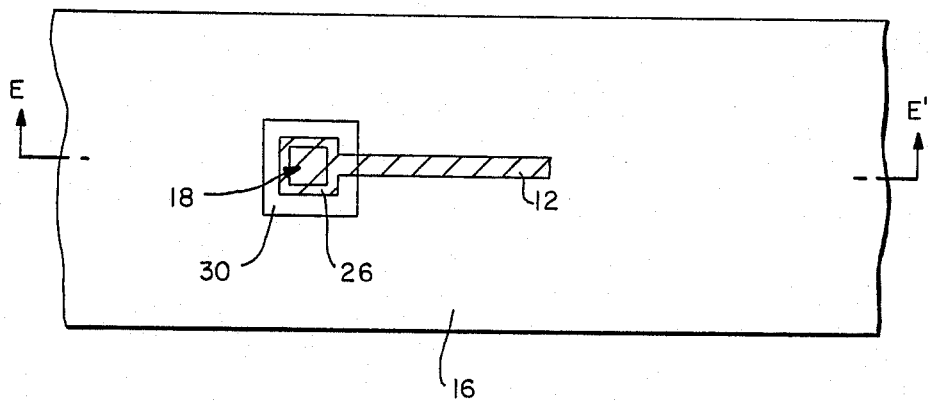
FIG.—2A

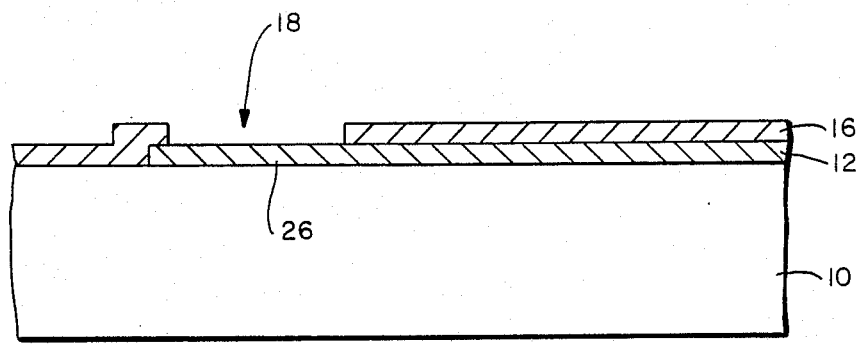
FIG.—2B
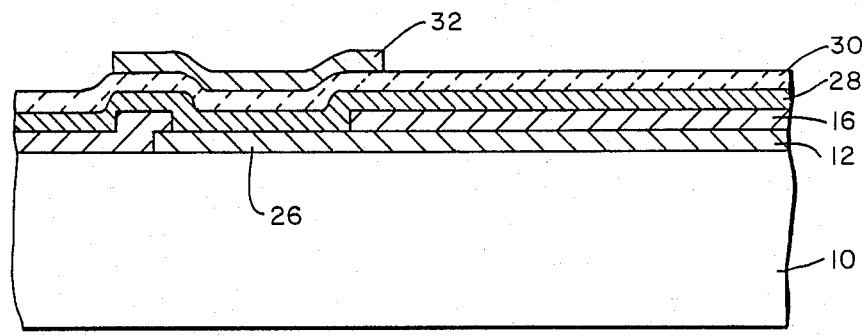
FIG.—2C

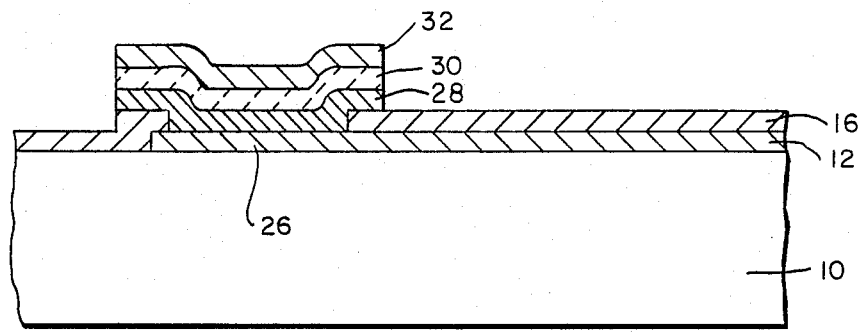
FIG.—2D
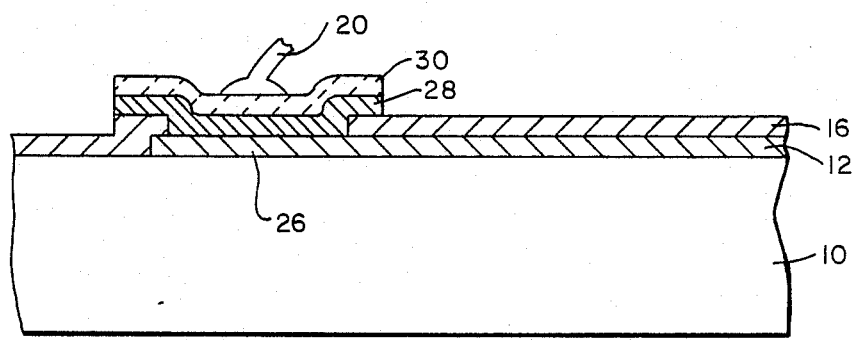
FIG.—2E

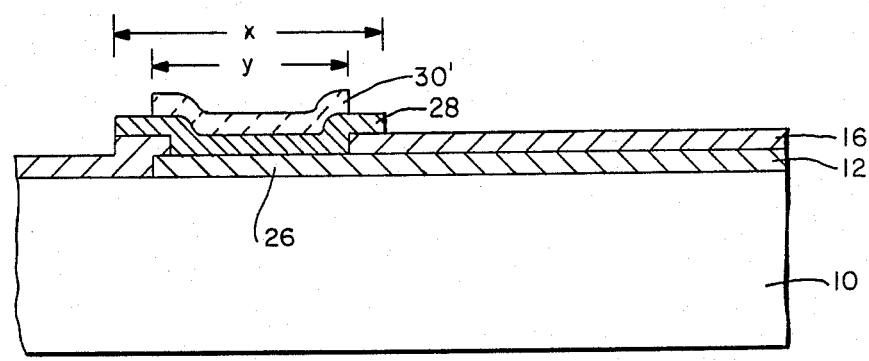
FIG.—3
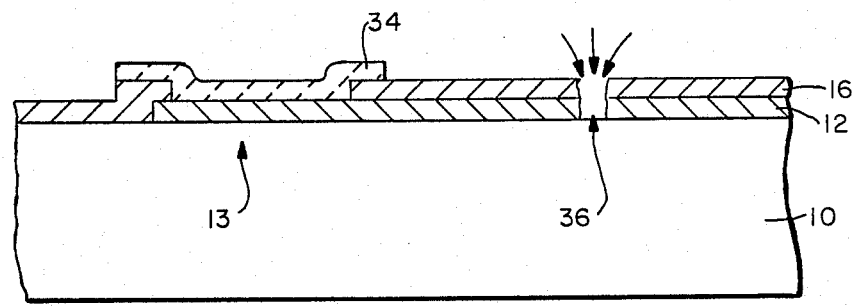
FIG.—4

METHOD OF PERFORMING ELECTRICAL REJECT SELECTION

CROSS-REFERENCE TO RELATED APPLICATION

The subject Application is related to the following Application, assigned to the assignee of the subject Application: CORROSION TOLERANT BONDING PAD, inventor Owen W. Hatcher, Jr., U.S. patent application Ser. No. 188,294, filed Apr. 29, 1988.

BACKGROUND OF THE INVENTION

1. Field of the Invention

The present invention relates to a method of performing an electrical reject selection of integrated circuit devices having damaged passivation layers.

2. Description of the Related Art

In conventional integrated circuits, as shown in the partial cross-section of FIG. 1, interconnects 12 provide electrical connections between individual devices (not shown) on the integrated circuit and extend to the edges of the integrated circuit where enlarged regions called bonding pads 13 are provided. Metal "lead" wires 14 are attached to the bonding pads 13 in order to apply power, signals, and other electrical interconnections to the integrated circuit. The interconnects 12 are usually formed of 90%–100% pure aluminum and lead wires 14 are usually formed of gold, but may also be formed of aluminum. Lead wires 14 are attached to the bonding pads 13 by thermal compressive bonding which creates a bonded region 15.

The interconnects 12 and bonding pads 13 are covered and protected by passivation layer 16 formed of $SiO_2$, doped $SiO_2$, $Si_3N_4$, or a combination of layers formed of these materials. Any defects 17 in the passivating layer 16, e.g., cracks, pinholes, and other attributes of the passivating layer 16 which expose the underlying interconnects 12 to contaminants and corroding agents may be fatal flaws in an integrated circuit. In particular, a portion 12a of interconnect 12 will be oxidized and/or otherwise corroded in a manner which creates a discontinuity in the interconnect 12 or converts portion 12a of the interconnect 12 to a nonconducting material, e.g., aluminum oxide or aluminum hydroxide. In either case the result is an integrated circuit which does not function properly since the affected interconnect 12 does not conduct electricity. Failures of integrated circuits caused by defects in the passivating layer may not occur until long after integrated circuit fabrication; however, it is desirable to identify integrated circuits which have the potential for fail during manufacture to avoid selling such devices.

Defects in the passivating layer 16 are difficult if not impossible to detect visually—any attempt to perform a meaningful visual inspection would be both time consuming, expensive, subjective as to pass/fail determination, and at best able to detect only a fraction of the defects. Such visual inspection requires the use of a microscope or other optical device having a limited field of view. A magnification of at least 500× is required for meaningful examination, and many defects cannot be detected without the aid of a scanning electron microscope. Nevertheless, conventionally only those integrated circuits having visible defects have been identified as rejected devices prior to the wafer sort and packaging steps.

Destructive tests using an acid etch followed by a visual inspection have been performed to test the integrity of the passivation layer in completed integrated circuit devices. These destructive tests destroy any device tested, and thus cannot be used on a wafer-wide basis. Instead, selected devices are tested to attempt to identify lots of bad devices.

Corrosion of the bonding pads is also a problem. Apertures 18 of approximately 16–20 $mil^2$ are provided through portions of the passivating layer 16 corresponding to the center portions of the bonding pads 13 which are usually 20–25 $mil^2$. Bonded region 15, however covers only 30–70% of the portion of bonding pad 13 exposed by aperture 18. Thus, a portion of each bonding pad 13 remains exposed after the leads 14 are attached thereto. The regions of aperture 18 where bonded region 15 does not cover bonding pad 13 the aluminum bonding pad 13 is subject to oxidation, or other corrosion. This oxidation or corrosion transforms aluminum bonding pad 13 into a non-conducting material. If the oxidation of bonding pad 13 occurs in region 13b, it will cause increased resistance between the bonding pad 13 and interconnect 12, and in the worst case an open circuit between bonding pad 13 and the remaining portion of interconnect 12.

In the case where the passivation layer 16 is doped $SiO_2$, moisture which enters the integrated circuit package combines with phosphorous, which is present as a dopant in the passivating layers 16, to form phosphoric acid which reacts with the exposed aluminum converting the aluminum to aluminum oxide or aluminum hydroxide. This phenomenon is facilitated by the direct contact between the exposed portion of bonding pad 13, particularly portion 13b, and passivating layer 16.

Other corrosion sources may be associated with the packaging material of an integrated circuit. Generally, the packaging is a plastic material which may have components which cause corrosion. In addition, other sources of corrosive materials may exist in the integrated circuit itself or may occur as the result of fabrication or packaging processes.

SUMMARY OF THE INVENTION

It is, therefore, an object of the present invention to provide a method of identifying integrated circuits having defects in the passivating layer.

A further object of the present invention is to provide a method of fabricating a corrosion tolerant bonding pad for an interconnect which includes testing the integrity of a passivating layer provided on the interconnect.

Another object of the present invention is to provide a method of electrically testing to determine if the passivating layer is damaged which replaces conventional visual inspection.

In accordance with the method of the present invention, conventional integrated circuits can be tested to determine if the passivating layer has any defects, and integrated circuits having corrosion tolerant bonding pads can be fabricated by a method which includes steps for detecting defects in the passivating layer. In particular, a method of testing an integrated circuit having a corrosion tolerant bonding pad provided on a portion of an interconnect and a passivation layer provided on the remaining portion of the interconnect, to determine if the passivation layer is damaged, includes the steps of exposing a portion of the interconnect through an opening in the passivation layer, providing a barrier layer on the portion of the interconnect corresponding to the opening in the passivating layer, providing a bonding layer on the barrier layer, subjecting the integrated circuit to an etchant which etches the interconnect so that any portion of the interconnect underlying a damaged portion of the passivating layer is etched, and determining if the etching step has created any discontinuities in the interconnect.

An advantage of the present invention is that integrated circuits which have the potential for failure due to defects in the passivating layer(s) can be identified during fabrication.

BRIEF DESCRIPTION OF THE DRAWINGS

FIG. 1 is a cross-sectional view of a conventional bonding pad;

FIG. 2A is a plan view of a corrosion tolerant bonding pad in accordance with the present invention;

FIGS. 2B–2E are cross-sectional views for describing the method of the present invention, where FIG. 2E is a cross-section taken along line E—E' in FIG. 2A;

FIG. 3 is a cross-sectional view of an alternative embodiment of a corrosion tolerant bonding pad in accordance with the present invention; and FIG. 4 is a cross sectional view for describing the method of the present invention when utilized with an integrated circuit having conventional bonding pads.

DESCRIPTION OF THE PREFERRED EMBODIMENTS

A method of fabricating corrosion tolerant bonding pads and determining if the integrated circuit has any defects in the passivating layer(s) will be described with reference to FIGS. 2A–E, and 3. A method of detecting defects in the passivating layer(s) of integrated circuit devices having conventional bonding pads will be described with reference to FIG. 4. It is to be understood that the materials, thicknesses, structures, and process parameters described with respect to the preferred embodiments of the present invention are exemplary and are not intended to limit the scope of the invention. The term "bonding pad" refers to any single or multi-layer structure useful in the electrical interconnection of an interconnect and a lead wire. The term "defect," as applied to a passivating layer, means any structural aspect of a passivating layer which exposes any layer(s) underlying the passivating layer to the atmosphere encountered by the exposed surface of the passivating layer.

An integrated circuit having a completed corrosion tolerant bonding pad is shown in FIGS. 2A and 2E. The integrated circuit would be one of many integrated circuits simultaneously formed on a single wafer, and thus this discussion will alternately refer to single and plural integrated circuits. A substrate 10 has an interconnect 12 provided thereon; as in conventional semiconductor devices, interconnect 12 may be formed of aluminum or compounds of aluminum and materials such as copper and/or silicon, e.g., aluminum-copper, aluminum-silicon, and aluminum-copper-silicon. Alternatively, interconnect 12 may be formed of other materials or compounds which are electrical conductors and useful in fabricating semiconductor devices in accordance with techniques known in the semiconductor industry. Further, the interconnect 12 may be formed directly on substrate 10 or on other layers provided on substrate 10, for example, interconnect 12 may be provided on insulating layers which separate it from other underlying interconnects (not shown) in, for example, a dual metallization structure.

A passivating layer 16, formed by conventional techniques, is provided on interconnect 12 and has an aperture (or opening) 18 to expose an enlarged bonding area 26 of interconnect 12. To prevent oxidation or other corrosion of bonding area 26 of interconnect 12, a corrosion resistant, conductive barrier layer 28 is provided on bonding area 26 in aperture 18 of passivating layer 16. Examples of the materials which may be utilized to form barrier layer 28 are tungsten and titanium and compounds of these materials, or other materials which are not subject to significant oxidation or corrosion when exposed to phosphoric acid and other agents present in a packaged integrated circuit. The barrier layer may be formed of a compound of titanium and tungsten (ti-tungsten or TiW) having a thickness of approximately 1000–2000 Å.

To prevent exposure of bonding area 26 of interconnect 12 to oxidizing or other corrosive environments, barrier layer 28 is provided both in the entirety of aperture 18 and on portion 14a of passivating layer 14 surrounding aperture 18. Barrier layer 28 may be formed by co-sputtering from titanium and tungsten targets or electron beam (E-beam) deposition. The barrier layer should make an ohmic contact with interconnect 12. Thus, oxidation of interconnect 12 prior to deposition of barrier layer 28 must be avoided and, if any oxidation does occur, the oxide should be removed by, for example, reverse sputtering.

A bonding layer 30 formed of, for example, aluminum, is provided on barrier layer 28, and lead wire 14 is attached to bonding layer 30 using conventional bonding techniques, for example, thermal compressive bonding. Bonding layer 30 may also be formed of gold. If the bonding layer 30 is gold, it could be fabricated by standard lift-off techniques. In the preferred embodiment bonding layer 30 is formed of 90%–100% pure aluminum and has a thickness of approximately 1 μm. However, thicknesses ranging from 0.25 to 2 μm may be used. Bonding layer 30 may be provided with the same techniques used to provide barrier layer 28. Again, an ohmic contact must be provided between barrier layer 28 and bonding layer 30.

Another characteristic of the material selected for barrier layer 28 is that it must not be penetrated by the material of bonding layer 30 during subsequent fabrication steps or at temperatures experienced in operation of the integrated circuit.

This structure prevents corrosion of bonding area 26 of interconnect 12 and even if bonding pad 30 corrodes, the portion of bonding pad 30 underlying bond 18 will be protected from corrosion, thereby preventing or substantially delaying increased resistance and/or open circuits between lead wires 14 and interconnects 12.

A method of fabricating a corrosion tolerant bonding pad and detecting defects in passivating layer 16 will be described with reference to FIGS. 2B–E. First, interconnect 12 having an enlarged bonding area 26 is provided on substrate 10—as discussed above the substrate may be a combination of several different layers. Then, passivating layer 16 is provided on interconnect 12 and aperture 18 is opened in passivating layer 16.

Next, as shown in FIG. 2C, barrier layer 28 and bonding layer 30 are deposited as continuous layers. A masking layer is provided on bonding layer 30 and patterned utilizing standard photolithographic technique so that a mask 32 having the shape of the bonding pad remains.

Mask 32 is used to define the shape of the bonding pad while the undesired portions of barrier layer 28 and bonding layer 30 are removed, as shown in FIG. 2D. At this point in the process, whle mask 32 is in place, the integrated circuit is exposed to an etchant which penetrates any defects in passivating layer 16 and etches the material which forms interconnect 12. If any defects are present in passivating layer 16, the etchant will attack the interconnect 12, thereby creating a discontinuity in interconnect 12. Mask 32 is then removed.

When the integrated circuit is subject to wafer sorting, including electrical testing, the integrated circuit will fail testing if any interconnects 12 do not conduct due to the presence of discontinuities created during the etching step. Although the interconnects 12 may not conduct for other reasons, integrated circuits subject to the process of the present invention will not pass testing if defects exist in their passivating layers 16. Integrated circuits which pass the wafer sorting test are sent to subsequent processing which includes separation of the individual die on a wafer, packaging, and the bonding of lead wires 20. Importantly, all devices on a wafer may be tested without damaqing devices which do not have defects in the passivating layer 16.

The primary etchant used to detect defects in the passivating layer 30 may be phosphoric acid. With phosphoric acid as the primary etchant, comprising approximately 90% of the etching solution, nitric acid and/or acidic acid may be added to the etching solution. Other wet etchants and methods of etching other than wet etching may be utilized. For example, isotropic plasma etching could be utilized. Indeed, any manner of etching which performs lateral etching can be utilized. Lateral etching causes the entire width of an interconnect 12 to be etched even though a defect in the passivating layer 16 does not extend over the entire width of the interconnect 12.

It is noted, however, that it is not required that the entire width of an interconnect 12 be etched. It is possible to detect partial etching of an interconnect 12 by measuring an increase in resistance along the interconnect 12 or by using other detection methods such as X rays.

To speed the etching process and to facilitate the penetration of cracks and other defects, the etchant may be heated. Temperatures of 40°-50° C. are contemplated as being useful for this purpose, although temperatures of 70°-80° C. or higher may be used.

The etching time is dependent on temperature and interconnect width and thickness. In general, the etching time must be long enough so that the entire width of an interconnect 12 will be etched. Thus, if a defect in a passivating layer 16 exists at one side of an interconnect 12, a discontinuity will still be created in the interconnect 12. For interconnects having a thickness of 0.5–1.5 $\mu$m and a width of 5–75 $\mu$m etching times of 10–15 minutes can be used with etchant temperatures of 40°-50° C. and etching times of 5 minutes or less can be used with etchant temperatures of 70°-80° C.

An alternative embodiment of a corrosion tolerant bonding pad will be described with reference to FIG. 3. In the alternative embodiment the bonding layer 30' has a smaller area than the barrier layer 28. For example, if the barrier layer 26 and bonding layer 30' are square and have respective dimensions x and y, the area $x^2$ of barrier layer 28 is less than the area $y^2$ of bonding layer 30'. The purpose of reducing the area of bonding layer 30' with respect to the area of barrier layer 28 is to increase the physical separation of the aluminum bonding layer 30' and passivating layer 16, thereby reducing or eliminating the possibility that phosphoric acid formed from the phosphorous dopant ions in the passivating layer will react with the aluminum of bonding layer 30'.

The reduced size of bonding layer 30' may be accomplished by two methods. As discussed above, barrier layer 28 and bonding layer 30' are deposited as continuous layers which are patterned by standard photolithographic techniques. If a single mask is to be used to etch the patterns of both barrier layer 28 and bonding layer 30', the integrated circuit would first be subject to an etchant which etches the aluminum bonding layer 30', then to an etchant which etches the material of barrier layer 28, and thereafter to a second etching with an etchant for aluminum to cause lateral etching of bonding layer 30'. In this method the etchant for aluminum must be a selective etchant which does not etch the material of the barrier layer 28. The selectivity of the etchant may be provided by selecting appropriate etchants or by selecting materials for barrier layer 25 and bonding layer 30' which are not affected by the same etchants.

If separate masks are used to etch the patterns of barrier layer 28 and bonding layer 30', then the areas of the mask which are used to protect the barrier layer 28 and the bonding layer 30' during the etching process are selected to provide the desired difference in the area of barrier layer 30'. In either of the techniques used in the second embodiment of the invention, the etchant utilized to perform the lateral etching of aluminum bonding layer 30, after barrier layer 28 is removed from the majority of the passivating layer 16, passivating layer 16 and any portions of interconnect 12 underlying any defects in passivating layer 16 will be exposed to the etchant during the lateral etching of the bonding layer 30.

The method of the present invention may be practiced by masking any portion of the integrated circuit intentionally exposed by through the passivating layer 16 (for example, conventional bonding pads, as discussed below) prior to subjecting the integrated circuit to an etchant which etches the interconnect 12. FIG. 4 illustrates an integrated circuit having a conventional bonding pad 13 and a mask 34 provided on the bonding pad 13 so that the integrated circuit may be subject to an etchant. The etchant creates discontinuities 36 in the portions of interconnect 12 underlying defects in passivating layer 16. Accordingly, integrated circuits having defects in the passivating layer 16 can be identified during the wafer sort process.

Any know method of wafer probing, i.e., performing functional testing before the integrated circuit is packaged, can be utilized to determine if discontinuities have been created in the interconnect 12 by the etching step of the present invention. Examples of wafer probing methods include electrical probing utilizing mechanical probes which physically contact each bonding pad and various types of beam probing in which electrical currents are induced in the interconnects by bombarding the integrated circuit with an electron beam or a laser beam. Further, discontinuities in the interconnect may be detected using x-rays.

The many features and advantages of the method of fabricating a corrosion tolerant bonding pad and simultaneously detecting defects in the passivation layer in accordance with the present invention will be apparent to those of ordinary skill in the art. Thus, the following claims are intended to cover all modifications and equivalents falling within the scope of the invention.

What is claimed is:

1. A method of identifying defects in a passivating layer provided on an interconnect, comprising the steps of:
   (a) providing a mask on any portion of the integrated circuit intentionally exposed by the passivating layer;
   (b) exposing the passivating layer to an etchant, thereby etching portions of the interconnect underlying damaged portions of the passivating layer; and
   (c) testing the interconnect to detect any etching of the interconnect after said step (b).

2. A method according to claim 1, wherein said step (c) comprises wafer sorting.

3. A method according to claim 1, wherein said step (a) comprises masking bonding pads provided on the interconnect.

4. A method according to claim 1, wherein said step (c) comprises electrically testing the interconnect to detect any discontinuities in the interconnect.

5. A method of testing to identify integrated circuits having defects in a passivating layer provided on an interconnect, comprising the steps of:
   (a) exposing a portion of the interconnect through an aperture in the passivating layer;
   (b) providing a corrosion tolerant bonding pad on the portion of the interconnect exposed by the aperture in the passivating layer;
   (c) exposing the passivating layer to an etchant, thereby etching portions of the interconnect underlying damaged portions of the passivating layer; and
   (d) testing the interconnect to detect discontinuities in the interconnect after said step (c).

6. A method according to claim 5, wherein said step (c) comprises wafer sorting.

7. A method according to claim 5, wherein said step (a) comprises masking bonding pads provided on the interconnect.

8. A method according to claim 5, wherein said step (c) comprises electrically testing the interconnect.

9. A method of testing an integrated circuit having a corrosion tolerant bonding pad provided on a portion of an interconnect and a passivation layer provided on the interconnect to determine if the passivation layer is damaged, comprising the steps of:
   (a) exposing a portion of the interconnect through an opening in the passivating layer;
   (b) providing a barrier layer on the portion of the interconnect corresponding to the opening in the passivating layer;
   (c) providing a bonding layer on the barrier layer;
   (d) subjecting the integrated circuit to an etchant which etches the interconnect so that a portion of the interconnect underlying a damaged portion of the passivating layer is etched; and
   (e) determining if said step (d) created discontinuities in the interconnect.

10. A method according to claim 9, wherein said step (b) further comprises providing the barrier layer on portions of the passivating layer surrounding the opening in the passivating layer.

11. A method according to claim 10, wherein said step (b) comprises providing a titanium and tungsten barrier layer.

12. A method according to claim 11, wherein said step (c) comprises providing an aluminum bonding layer.

13. A method according to claim 9, wherein said step (d) further comprises laterally etching the bonding layer to reduce the area of the bonding layer.

14. A method according to claim 9, wherein said step (c) comprises wafer sorting.

15. A method according to claim 9, wherein said step (a) comprises masking bonding pads provided on the interconnect.

16. A method according to claim 9, wherein said step (c) comprises electrically testing the interconnect.

17. A method of fabricating a corrosion tolerant bonding pad for an interconnect formed on a substrate and testing the integrity of a passivating layer provided on the interconnect, comprising the steps of:
   (a) exposing a portion of the interconnect through an aperture in the passivating layer;
   (b) providing a barrier layer on the portion of the interconnect exposed through the aperture in the passivating layer;
   (c) providing a bonding layer on the barrier layer;
   (d) masking the barrier layer and the bonding layer;
   (e) exposing the passivating layer to an etchant which etches the interconnect after masking the barrier layer and the bonding layer; and
   (f) testing the interconnect to detect discontinuities in the interconnect created by said step (e).

18. A method of fabricating a corrosion tolerant bonding pad for an interconnect formed on a substrate and electrically testing the integrity of a passivating layer provided on the interconnect, comprising the sequential steps of:
   (a) exposing a portion of the interconnect through an aperture in the passivating layer;
   (b) providing a barrier layer on the portion of the interconnect exposed through the aperture in the passivating layer and on the passivating layer;
   (c) providing a bonding layer on the barrier layer;
   (d) providing a mask on a portion of the barrier layer and the bonding layer corresponding to the aperture in the passivating layer and to a selected portion of the passivating layer surrounding the aperture in the passivating layer;
   (e) removing the portion of the barrier layer and the bonding layer other than the portion of the barrier layer and the bonding layer underlying the mask;
   (f) exposing the passivating layer to an etchant which etches the interconnect; and
   (g) applying an electrical current to the interconnect to detect discontinuities in the interconnect created by said step (f).

* * * * *